United States Patent [19]

Ishibe

[11] Patent Number: 5,583,354
[45] Date of Patent: Dec. 10, 1996

[54] SOLID-STATE IMAGING DEVICE HAVING MICROLENSES

[75] Inventor: Shouichi Ishibe, Fukuyama, Japan

[73] Assignee: Sharp Kabushiki Kaisha, Osaka, Japan

[21] Appl. No.: 404,140

[22] Filed: Mar. 13, 1995

Related U.S. Application Data

[62] Division of Ser. No. 67,461, May 26, 1993, Pat. No. 5,422,285.

[30] Foreign Application Priority Data

May 27, 1992 [JP] Japan .................................. 4-135379

[51] Int. Cl.[6] .............................................. H01L 27/148
[52] U.S. Cl. ........................ 257/232; 257/232; 257/432; 257/435; 257/443
[58] Field of Search .................................. 257/222, 232, 257/233, 432, 435, 443; 250/208.1, 211 J; 358/212; 359/619, 620

[56] References Cited

U.S. PATENT DOCUMENTS

| Re. 31,255 | 5/1983 | Geddes ..................... | 257/98 X |
|---|---|---|---|
| 3,724,924 | 4/1973 | Lenfant et al. ................ | 359/620 |
| 4,322,753 | 3/1982 | Ishihara ...................... | 257/230 |
| 4,694,185 | 9/1987 | Weiss ......................... | 257/432 |
| 4,721,999 | 1/1988 | Takemura et al. ............... | 430/321 |
| 4,966,831 | 10/1990 | Mehra et al. .................. | 430/321 |
| 5,118,924 | 6/1992 | Mehra et al. .................. | 257/222 |
| 5,132,759 | 7/1992 | Honjah et al. ................. | 257/452 |
| 5,239,412 | 8/1993 | Naka et al. ................... | 359/619 |
| 5,293,267 | 3/1994 | Nakai ......................... | 359/619 |
| 5,296,724 | 3/1994 | Ogata et al. .................. | 257/99 X |
| 5,321,297 | 6/1994 | Enomoto ....................... | 359/619 |

FOREIGN PATENT DOCUMENTS

| 0242663A2 | 10/1987 | European Pat. Off. ............. | 257/432 |
|---|---|---|---|
| 0511404A1 | 11/1992 | European Pat. Off. ............. | 257/432 |
| 0523825A1 | 1/1993 | European Pat. Off. ............. | 257/432 |
| 60-53073 | 3/1985 | Japan ......................... | 257/432 |
| 60-59752 | 12/1985 | Japan ......................... | 257/432 |
| 62-42558 | 2/1987 | Japan ......................... | 257/434 |
| 2178952 | 7/1990 | Japan ......................... | 257/434 |
| 3-148173 | 6/1991 | Japan ......................... | 257/432 |
| 3-163871 | 7/1991 | Japan ......................... | 257/432 |

OTHER PUBLICATIONS

Y. Sano et al., *Optoelectronics Devices and Technologies*, 6(2);219–229 (1991).

Patent Abstracts of Japan, 8(206) (1984), 59–90467, Saeki.

Patent Abstracts of Japan, 13(184) (1989), 1–10666, Kazuaki.

*Primary Examiner*—Minhloan Tran
*Attorney, Agent, or Firm*—David G. Conlin; Peter F. Corless

[57] ABSTRACT

A solid-state imaging device is disclosed. The solid-state imaging device includes: a plurality of photosensitive elements for converting light into electric charge, the plurality of photosensitive elements being arranged in a matrix form; a plurality of first charge transfer portions for transferring the converted electric charge in a first direction, the plurality of first charge transfer portions being formed between the plurality of photosensitive elements arranged along a second direction; a second charge transfer portion for receiving the electric charge from the plurality of first charge transfer portions and for transferring the electric charge in the second direction, the second charge transfer portion being provided at an end of each of the plurality of first charge transfer portions; a plurality of light converging portions for converging the light on each of the plurality of photosensitive elements, the plurality of light converging portions being formed over the plurality of photosensitive elements, respectively; and wherein the plurality of light converging portions are microlenses, each of the microlens having substantially the same curvature in the first and second directions.

3 Claims, 7 Drawing Sheets

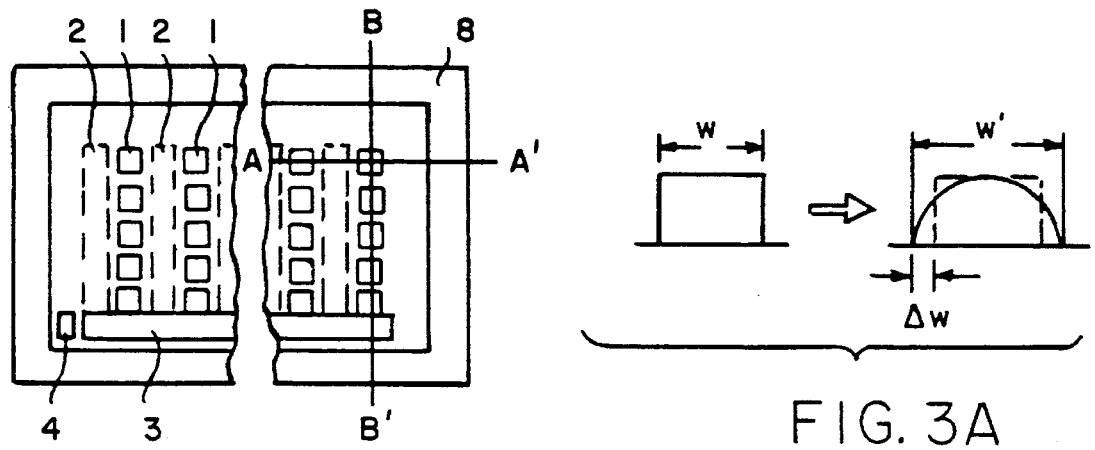
FIG. 2
FIG. 3A
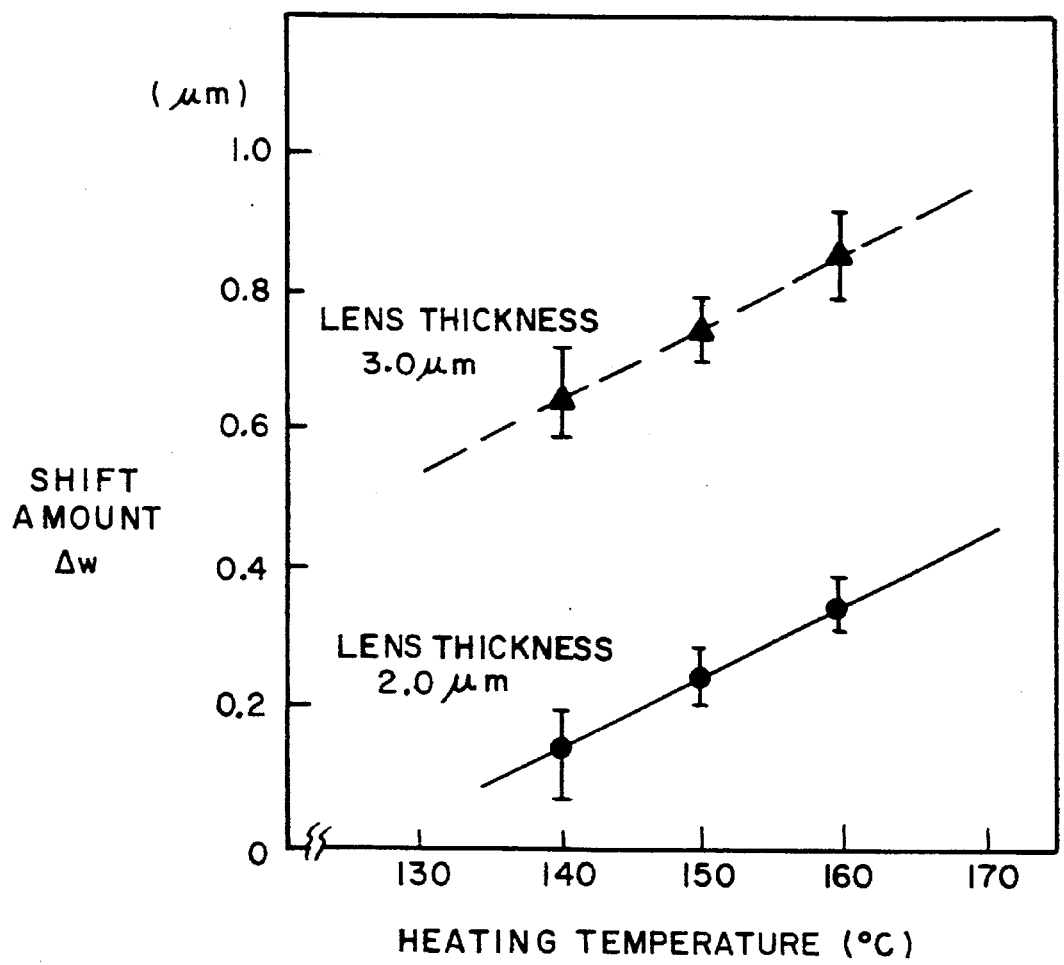
FIG. 3B

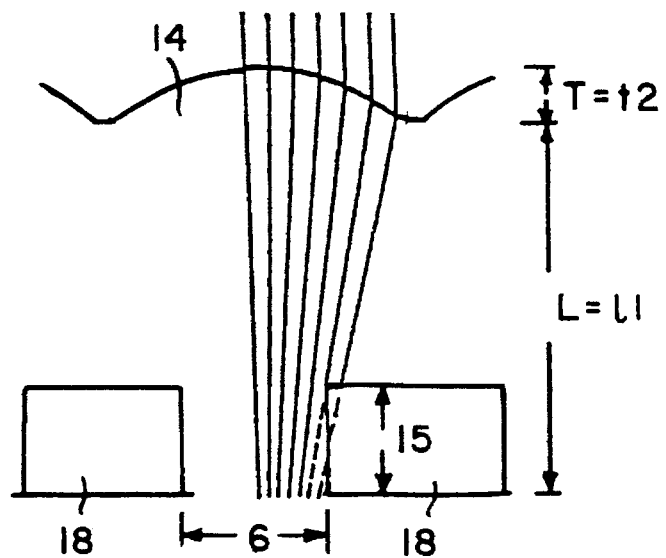
FIG. IOA PRIOR ART
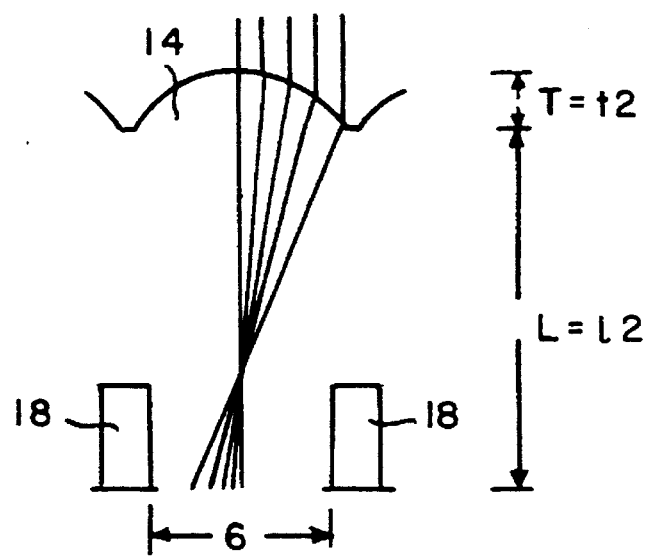
FIG. IOB PRIOR ART

SOLID-STATE IMAGING DEVICE HAVING MICROLENSES

This is a divisional of application Ser. No. 08/067,461 filed on May 26, 1993 now U.S. Pat. No. 5,422,285.

BACKGROUND OF THE INVENTION

1. Field of the Invention

The present invention relates to a solid-state imaging device including light converging means above a photosensitive element, and a method of producing the same.

2. Description of the Related Art

As a type of solid-state imaging device, a charge-coupled device (CCD) type solid-state imaging device of interline transfer system is known. Such a CCD type solid-state imaging device includes a photosensitive element for converting light into electric charge and a CCD which transfers the electric charge. Referring to FIG. 4, such a CCD type solid-state imaging device 101 is illustrated. The solid-state imaging device 101 includes a plurality of photosensitive elements 1 of pn-junction photodiodes for converting light into electric charge. As is shown in FIG. 4, the plurality of photosensitive elements 1 are arranged on a semiconductor substrate 8 such as a silicon substrate, in an array of rows and columns along a first direction (hereinafter, referred to as a vertical direction) and a second direction (hereinafter, referred to as a horizontal direction) which is substantially perpendicular to the first direction. Between the photosensitive elements 1 which are adjacent to each other in the horizontal direction, vertical CCD register portions 2 extending in the vertical direction are formed. One end of each of the vertical CCD register portions 2 is connected to a horizontal CCD register portion 3 which is positioned perpendicular to the vertical CCD register portions 2. Moreover, in the vicinity of the horizontal CCD register portion 3, an output portion 4 for extracting the electric charge from the horizontal CCD register 3 is provided. Over the above-mentioned vertical CCD register portions 2 and horizontal CCD register portion 3, a light blocking film (not shown) for preventing light from reaching an area other the photosensitive elements 1.

FIG. 5A shows a cross section along the horizontal direction of the solid-state imaging device 101 taken along a line A–A' in FIG. 4. The semiconductor substrate 8 includes a photosensitive region 6 and a transfer region 5 in which the photosensitive element 1 and a CCD 31 are formed, respectively. Above the CCD 31, first and second polycrystalline silicon (polysilicon) electrodes 9 and 10 are formed. The vertical CCD register portion 2 is constituted by the CCD 31, and the first and second polysilicon electrodes 9 and 10. In addition, above the second polysilicon electrode 10, a light blocking film 11 is formed. A distance from the surface of the semiconductor substrate 8 to the top face of the light blocking film 11 is indicated by a height 15. A passivation film 12 is formed so as to cover the entire face of the substrate.

FIG. 5B shows a cross section along the vertical direction of the solid-state imaging device 101 taken along a line B–B' in FIG. 4. In the photosensitive region 6 of the semiconductor substrate 8, the photosensitive element 1 is formed. A pixel isolating region 7 is formed in the semiconductor substrate 8 between the photosensitive elements 1 which are adjacent to each other in the vertical direction. Above the pixel isolating region 7, the first and the second polysilicon electrodes 9 and 10 are formed. Above the second polysilicon electrode 10, the light blocking film 11 is formed. Then, a passivation film 12 is formed so as to cover the entire face of the substrate.

The light blocking film 11 is formed in such a manner that it covers an area which is considerably close to the photosensitive element 1 in order to reduce smear. Over the entire surface of the semiconductor substrate 8 on which the light blocking film 11 has been formed, the passivation film 12 is formed as the uppermost layer. Between the first polysilicon electrode 9 and the second polysilicon electrode 10, and between the second polysilicon electrode 10 and the light blocking film 11, an insulating film 12' such as a silicon oxide film is formed so as to insulate them from each other, respectively.

In the solid-state imaging device 101 having the above-mentioned construction, the surface of the semiconductor substrate 8 includes the transfer regions 5 and the pixel isolating regions 7 in addition to the photosensitive regions 6 having the photosensitive elements 1. According to the construction, an area occupied by the photosensitive elements 1 is small as compared with the total surface area of the semiconductor substrate 8, and among light beams 32 and 33 incident on the solid-state imaging device 101, only the light beams 32 which are incident on areas above the photosensitive regions 6 can penetrate the solid-state imaging device 101 and reach the photosensitive regions 6, so as to be converted into electric charge for providing image information. Specifically, in the case of the solid-state imaging device 101 FIGS. 5A and 5B, only approximately 25% of the incident light can contribute to provide image information. This means that the penetrating efficiency of light is not so good, and hence the sensitivity of the solid-state imaging device 101 is poor.

In order to eliminate the above disadvantage, there is proposed an additional formation of microlenses 14 on the solid-state imaging device 101 having the above-mentioned construction. The microlenses 14 can improve the penetrating efficiency of light which can reach the photosensitive regions 6, so as to enhance the sensitivity of the solid-state imaging device 101 with the microlenses 14. FIG. 6A shows a cross section along the horizontal direction of a solid-state imaging device 102 with the microlenses 14. FIG. 6B shows a cross section along the vertical direction of the solid-state imaging device 102.

In the solid-state imaging device 102 shown in FIGS. 6A and 6B, a transparent resin layer 13 is formed on the surface of the solid-state imaging device 101 as shown in FIGS. 5A and 5B, for example, and thereon, the microlenses 14 for converging the incident light onto the photosensitive regions 6 are formed. The transparent resin layer 13 is formed for the purpose of adjusting for the focal lengths of the microlenses 14. In the case where the solid-state imaging device 102 of FIGS. 6A and 6B is a color solid-state imaging device, color filters are provided above the respective photosensitive regions 6 so as to be vertically sandwiched within the transparent resin layer 13.

There are two methods for forming such a microlens. In one method, a photoresist is first applied uniformly. Part of the photoresist corresponding to the periphery of the microlens to be formed is removed by photolithography and etching techniques, so as to form a resist pattern. Then, the edge portion of the resist pattern is melted by heating, so as to form the microlens 14 (Japanese Patent Publication No. 60-59752). As the material for the microlens 14, this method uses a material capable of being removed by the photolithography and etching techniques. The other method uses a material with no photosensitivity for the microlens 14. That is, in the other method, various kinds of materials are available as a material for the microlens 14. In the latter method, a layer of high light-transmitting material is formed and a thermally deformable resin layer is formed thereon. The thermally deformable resin layer is then selectively removed, so as to leave part of the resin layer above the photosensitive region. The remaining part of the thermally deformable resin layer is deformed by heating. By using the deformed layer as a mask, the high light-transmitting material layer is selectively removed by a dry etching technique, so as to form the microlens 14 (Japanese Laid-Open Patent Publication No. 60-53073).

When the microlens 14 is formed by either one of the above-described two methods, the heights h1 and h2 of the microlens 14 in the horizontal and the vertical cross sections of FIGS. 6A and 6B are equal to each other. However, the widths w1 and w2 are different from each other. The width w1 along the horizontal direction is obtained by subtracting a gap 16 between the microlenses 14 from the arranged pitch of the microlenses 14. The width w2 is obtained by subtracting a gap 16 from the arranged pitch of the microlenses 14 in the vertical direction. In order to efficiently converge the incident light on the photosensitive region 6, the gap 16 between the microlenses 14 should be made as small as possible, and the widths w1 and w2 of the microlens 14 should be made as large as possible. Therefore, as is shown in FIGS. 6C and 6D, a resist pattern 19 is formed on the transparent resin layer 13 in such a manner that gaps 20 between the adjacent resist patterns 19 in the horizontal and the vertical directions are set to be a minimum value which can be attained by the process. For example, in a solid-state imaging device which is designed under a submicron rule, the gap 20 is set to be 0.6 to 0.8 µm. In a solid-state imaging device which is designed under a half-micron rule, the gap 20 is set to be 0.5 µm.

As described above, in the solid-state imaging device 102, the heights h1 and h2 of the microlens 14 are equal, but the widths w1 and w2 thereof in the horizontal and the vertical directions are different. This means that the curvatures of the microlens 14 in the horizontal and the vertical directions are different, which causes a difference between the focal lengths in the horizontal and the vertical directions. In this specification, the term "curvature" of a microlens is defined as a multiplicative inverse of the radius of a circle which approximates the convex curve of the microlens. Accordingly, the converging conditions of the incident light 17 in the vertical and the horizontal directions are also different. Moreover, there arise the following problems except for the case where the arranged pitches of pixels are the same in the horizontal and the vertical directions. The problems are described by referring FIGS. 7A, 7B, 8, 9A, 9B, 10A, and 10B. These figures simulate the converging conditions in the solid-state imaging device with the microlens 14. The simulation utilizes Snell's law. FIGS. 7A, 9A and 10A show cross sections along the horizontal direction. FIGS. 7B, 8, 9B, and 10B show cross sections along the vertical direction. In each of the figures, the reference numeral 18 denotes a layer including the first and second polysilicon electrodes 9 and 10, the light blocking film 11, and the like above the transfer region 5 or the pixel isolating region 7. A thickness of the transparent resin layer 13 and a thickness of the microlens 14 are indicated by L and T, respectively.

FIGS. 7A and 7B show in part a solid-state imaging device for using in a NTSC (National Television System Committee) system having 525 scanning lines in the vertical direction. The solid-state imaging device has a photosensitive screen of ½-inch optical system. As is shown in FIG. 7A, a width of the microlens 14 in the horizontal direction is about 12.5 µm, and as is shown in FIG. 7B, a width of the microlens 14 in the vertical direction is about 10.0 µm. The thickness L of the transparent resin layer 13 is set to be l1 and the thickness T of the microlens 14 is set to be t1. In this case, even when the focal lengths in the horizontal and vertical directions are different due to a difference between the curvatures of the microlens 14 in the horizontal and the vertical directions, the incident light can be efficiently converged on the photosensitive region 6.

FIG. 8 shows a cross section of a solid-state imaging device for using in a PAL (phase alternation line) system having a photosensitive screen of ½-inch optical system. The solid-state imaging device has 625 scanning lines in the vertical direction. The solid-state imaging device for PAL system strongly necessitates the provision of microlenses 14, as compared with the device for NTSC system, in order not to degrade the sensitivity by reducing the pixel pitches and hence reducing an area of the photosensitive region 6. In this case, the pixel pitch in the vertical direction is set to be about 8.5 µm, which is smaller than about 10.0 µm in the device for NTSC system. Therefore, although the curvature of the microlens 14 in the horizontal direction is optimum, the curvature of the microlens 14 in the vertical direction is small as is shown in FIG. 8. As a result, the focal length is shorter than in the case for the NTSC system. Accordingly, part of the incident light is blocked by the light blocking film 11 in the layer 18 and cannot reach the photosensitive region 6, which causes the converging efficiency to degrade.

FIGS. 9A and 9B show cross sections of a solid-state imaging device for a NTSC system having a photosensitive screen of ⅓-inch optical system which is smaller than in the above examples. In this case, as is shown in FIG. 9B, the thickness L of the transparent resin layer 13 is reduced to be l2 (where l2<l1), in order to position the point of focus of the microlens 14 in the vertical direction on the photosensitive region 6.

FIGS. 10A and 10B show cross sections of a solid-state imaging device for a PAL system having a photosensitive screen of ⅓-inch optical system. In this case, as is shown in FIG. 10B, the thickness T of the microlens 14 is reduced to be t2 (where t2<t1), in order to position the point of focus of the microlens 14 in the vertical direction on the photosensitive region 6 by increasing the focal length.

However, according to the above construction, the focal length of the microlens 14 in the horizontal direction is unavoidably increased, as is shown in FIGS. 9A and 10A. As a result, unless a height 15 (e.g., FIG. 6C) from the surface of the semiconductor substrate 8 to the top face of the light blocking film 11 is sufficiently small, the converging efficiency of the microlens 14 in the horizontal direction is degraded, because the incident light is blocked by the light blocking film 11 in the layer 18. In other words, by positioning the focus point of the microlens 14 in either one of the horizontal and the vertical directions on the photosensitive region 6, the focus point in the other direction is not positioned on the photosensitive region 6. As a result, the converging efficiency of the microlens 14 is degraded.

As described above, according to the conventional solid-state imaging device using the microlens 14, the microlens 14 may have different widths w1 and w2 in the horizontal and the vertical directions in order to maximize the light receiving area. Therefore, the focal lengths relative to the horizontal and the vertical directions of the microlens 14 are different from each other. In a solid-state imaging device with small pixel pitches for a PAL system or for a NTSC system, when the focal point in either one of the horizontal and the vertical directions is positioned on the photosensitive region, the focal point in the other direction is not positioned on the photosensitive region. As a result, there arises a problem in that the converging efficiency of the microlens is degraded.

SUMMARY OF THE INVENTION

The solid-state imaging device of this invention includes: a plurality of photosensitive elements for converting light into electric charge, the plurality of photosensitive elements being arranged in a matrix form; a plurality of first charge transfer portions for transferring the electric charge converted in each of the plurality of photosensitive elements in a first direction, the plurality of first charge transfer portions being formed between the plurality of photosensitive elements along the first direction; a second charge transfer portion for receiving the electric charge from the plurality of first charge transfer portions and for transferring the electric charge in a second direction, the second charge transfer portion being provided at an end of each of the plurality of first charge transfer portions; a plurality of light converging portions for converging the light on each of the plurality of photosensitive elements, the plurality of light converging portions being formed over the plurality of photosensitive elements, respectively; and wherein the plurality of light converging portions are microlenses, each of the microlenses having substantially the same curvature in the first and second directions.

In one embodiment of the invention, respective convexed curves of the microlenses are in contact with each other in a direction corresponding to a direction of a shortest pitch of the matrix.

According to another aspect of the invention a method for producing a solid-state imaging device is provided. The method includes the steps of: forming a plurality of photosensitive elements for converting light into electric charge in a substrate near a surface thereof, the plurality of photosensitive elements being arranged in a matrix form; forming a plurality of first charge transfer portions for transferring the electric charge converted in each of the plurality of photosensitive elements in a first direction in the substrate near the surface thereof, the plurality of first charge transfer portions being formed between the plurality of photosensitive elements along the first direction; forming a second charge transfer portion for receiving the electric charge from the plurality of first charge transfer portions and for transferring the electric charge in a second direction, the second charge transfer portion being provided at an end of each of the plurality of first charge transfer portions in the substrate near the surface thereof; forming a plurality of patterns of a material over the plurality of photosensitive elements, respectively, each of the plurality of patterns having substantially the same lengths in the first and the second directions; and forming a plurality of light converging portions over the plurality of photosensitive elements by performing a deforming process for each of the plurality of patterns to deform the plurality of patterns into respective light converging portions, each of the plurality of light converging portions having substantially the same curvatures in the first and the second directions.

In one embodiment of the invention, the plurality of light converging portions are in contact with each other in a direction corresponding to a direction of a shortest pitch of the matrix.

In another embodiment of the invention, the deforming process includes the step of heat treating the plurality of patterns.

According to still another aspect of the invention, a solid-state imaging device is provided. The solid-state imaging device includes: a plurality of photosensitive elements for converting light into electric charge, the plurality of photosensitive elements being arranged in a matrix; a plurality of light converging portions for converging the light on each of the plurality of photosensitive elements, the plurality of light converging portions being formed over the plurality of photosensitive elements, respectively; and wherein the plurality of light converging portions are microlenses, each of the microlenses having substantially the same curvatures in a first and a second directions of the matrix.

In one embodiment of the invention, the microlenses are in contact with each other in at least one of the first and the second directions.

In another embodiment of the invention, the convexed curve of each microlens physically intersects with a convexed curve of a microlens adjacent to the microlens.

According to a solid-state imaging device of the invention, the microlens has the same curvatures in the vertical direction and in the horizontal direction. Therefore, by adjusting the focal length in either one of the vertical and the horizontal directions, the focal length in the other direction can be adjusted. As a result, substantially all of the light through the microlens can be converged on the photosensitive element without being blocked by the light blocking film, so that the converging efficiency can be improved. In addition, the solid-state imaging device of the invention is applicable to various pixel pitches required for the miniaturization of the device and the high integration of the pixels.

According to the method for producing the solid-state imaging device, the curvature of the microlens can be controlled by using a thermal deformation characteristic of a material of the microlens. Therefore, the focal lengths in the vertical and the horizontal directions can be set to be the same value, and a light receiving area can be increased. Thus, the converging efficiency can be improved.

Thus, the invention described herein makes possible the advantages of (1) providing a solid-state imaging device with high sensitivity in which the converging efficiency of a microlens can be improved, irrespective of the number of scanning lines and the arranged pitches of pixels, and (2) providing a method for producing the solid-state imaging device.

These and other advantages of the present invention will become apparent to those skilled in the art upon reading and understanding the following detailed description with reference to the accompanying figures.

BRIEF DESCRIPTION OF THE DRAWINGS

FIG. 2 is a plan view showing a solid-state imaging device according to the invention, FIG. 3A is a schematic diagram for illustrating the thermal deformation characteristic of a microlens material, FIG. 3B is a graph illustrating the thermal deformation characteristic of a microlens material.

FIG. 10A shows the converging conditions of light along the horizontal direction of a solid-state imaging device having a photosensitive screen of ⅓-inch optical system for PAL system.

FIG. 10B shows the converging conditions of light along the vertical direction of the solid-state imaging device having a photosensitive screen of ⅓-inch optical system for an interline transfer system for a PAL system.

DESCRIPTION OF THE PREFERRED EMBODIMENTS

Hereinafter, the present invention will be described by way of examples.

Figure 1A:
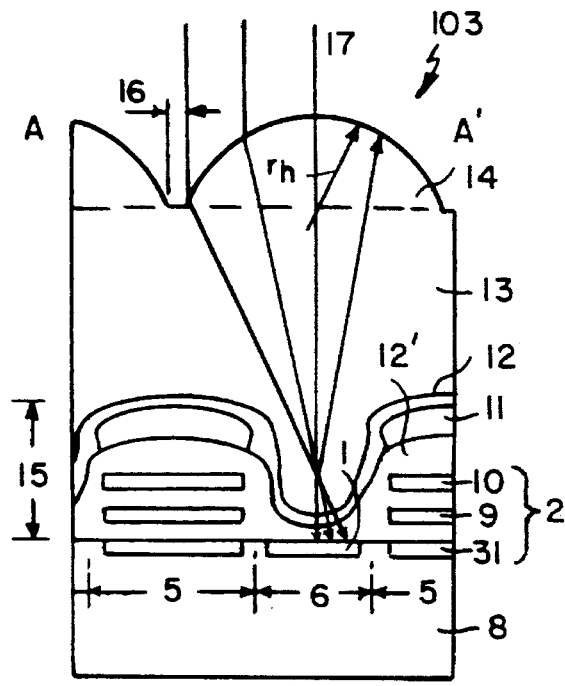
FIG. 1A is a cross-sectional view along the horizontal direction (taken along a line A–A' in FIG. 2) of a solid-state imaging device having a photosensitive screen of ½-inch optical system for an interline transfer system for a PAL system according to the invention.
Figure 1B:
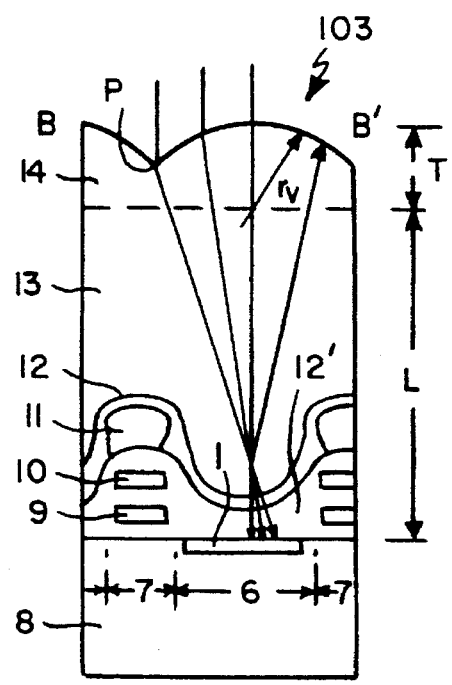
FIG. 1B is a cross-sectional view along the vertical direction (taken along a line B–B' in FIG. 2) of the solid-state imaging device of the invention.

FIG. 1A shows a cross section along the horizontal direction (taken along a line A–A' in FIG. 2) of a solid-state imaging device 103 having a photosensitive screen of ½-inch optical system for an interline transfer system for a PAL system. FIG. 1B shows a cross section along the vertical direction thereof (taken along a line B–B' in FIG. 2). FIG. 2 is a plan view of the solid-state imaging device 103 of FIGS. 1A and 1B. The solid-state imaging device 103 includes a plurality of photosensitive elements 1 of pn-junction photodiodes for converting light into electric charge. As is shown in FIG. 2, the plurality of photosensitive elements 1 are arranged on a semiconductor substrate 8 of a silicon substrate, in an array of rows and columns along a first direction (hereinafter, referred to as a vertical direction) and a second direction (hereinafter, referred to as a horizontal direction) which is substantially perpendicular to the first direction.

Between the photosensitive elements 1 which are adjacent to each other in the horizontal direction, vertical CCD register portions 2 extending in the vertical direction are formed as first direction charge transfer portions. Light incident on the respective photosensitive elements 1 is converted into electric charge by the photosensitive elements 1. The electric charge is transferred to the vertical CCD register portions 2 adjacent to the corresponding photosensitive elements 1. The electric charge transferred from the respective photosensitive elements 1 are further transferred in the vertical CCD register portions 2 in the vertical direction. At the ends of the vertical CCD register portions 2, a horizontal CCD register portion 3 as a second direction charge transfer portion is provided in a perpendicular manner to the vertical CCD register portions 2. The electric charge is transferred from the vertical CCD register portions 2 to the horizontal CCD register portion 3. Moreover, in the vicinity of the horizontal CCD register portion 3, an output portion 4 for extracting the electric charge from the horizontal CCD register 3 is provided. Over the above-mentioned vertical CCD register portions 2 and horizontal CCD register portion 3, a light blocking film (not shown) for preventing light from entering the device is formed.

The semiconductor substrate 8 includes a photosensitive region 6 and a transfer region 5 in which the photosensitive element 1 and a CCD 31 are formed, respectively. Above the CCD 31, first and second polysilicon electrodes 9 and 10 are formed. The vertical CCD register portion 2 is constituted by the CCD 31, and the first and second polysilicon electrodes 9 and 10. In addition, above the second polysilicon electrode 10, a light blocking film 11 is formed. A passivation film 12 is formed so as to cover the entire surface of the semiconductor substrate 8.

The light blocking film 11 is formed in such a manner that it covers an area which is considerably close to the photosensitive element 1 in order to reduce smear. Over the entire surface of the semiconductor substrate 8 on which the light blocking film 11 has been formed, the passivation film 12 is formed as the uppermost layer. Between the first polysilicon electrode 9 and the second polysilicon electrode 10, and between the second polysilicon electrode 10 and the light blocking film 11, an insulating film 12' such as a silicon oxide film is formed so as to insulating them from each other, respectively.

The passivation film 12 is formed over the entire surface of the semiconductor substrate 8, and on the entire surface of the passivation film 12, a transparent resin layer 13 is formed. Above each of the photosensitive elements 1 and on the transparent resin layer 13, a microlens 14 is formed. The transparent resin layer 13 is formed for the purposes of smoothing the surface of the semiconductor substrate 8, and of adjusting a distance from the focal point of the microlens 14 formed on the transparent resin layer 13 to the surface of the photosensitive region 6.

In each of the microlenses 14, the curvature $r_v$ in the vertical direction is set to be equal to the curvature $r_h$ in the horizontal direction. In this example, the microlenses 14 which are adjacent along the vertical direction are formed so as to be in contact with each other, i.e., the convexed curve of a given microlens 14 physically intersects with the convexed curve of an adjacent microlens 14 at point P, for example. In the horizontal direction, the adjacent microlenses 14 are formed to have a gap 16 therebetween. If the curvature $r_v$ in the vertical direction of the microlens 14 has substantially the same value as that of the curvature $r_h$ in the horizontal direction thereof, the effects of the invention can be attained. However, it is desired that the microlenses 14 be formed in contact with each other in either one of the vertical and horizontal directions whichever has smaller arranged pitches of arrayed photosensitive elements 1, in order to maximize the converging efficiency. In addition, in this example, the focal point of the microlens 14 is positioned slightly above the surface of the semiconductor substrate 8. Alternatively, if the converged light is all incident on the photosensitive element 1, the focal point of the microlens 14 may be positioned in the semiconductor substrate 8.

In this invention, for forming the microlenses 14 having the above curvatures and arrangement, an experiment as to the relationship between the heating temperature and the thermal deformation characteristic of a photoresist used for the microlenses 14 was conducted. In this example, as the photoresist having photosensitivity and superior transparency, CMS-DU which is commercially available from Tosoh Corp. was used.

As is shown in FIG. 3A, by heating, part of the resist pattern downwardly reaches the substrate so as to increase the bottom area of the resist pattern. At the same time, the resist pattern on the substrate takes a convexed and curved form. Assume that a resist pattern having a width w before the heating is deformed to have a width w' after the heating. The value corresponding to a half of a difference between the widths w and w' in a direction having a curvature of the convexed curve is represented by a shift amount Δw.

FIG. 3B is a graph showing the thermal deformation characteristic of the photoresist. The horizontal axis of the graph indicates a heating temperature (°C.) and the vertical axis thereof indicates a shift amount Δw (μm). The heating was conducted for four minutes. This graph shows a case where the width w of the resist pattern before heating is 7.8 μm. As seen from the graph of FIG. 3B, the relationship between the heating temperature and the shift amount Δw is substantially linear, though the relationship depends on the thickness of the microlens. Therefore, by changing the heating temperature, the microlens width w' can be adjusted in accordance with the thickness of the microlens.

The curvature of the microlens is determined by the thickness T of the photoresist and the shift amount Δw. Accordingly, if a desired heating temperature is selected by considering the difference between arranged pitches of pixels in the horizontal and the vertical directions, the curvature in the horizontal direction of the microlens can be set to be equal to the curvature in the vertical direction.

Hereinafter, with reference to FIGS. 1C, 1D, 2, 3A, and 3B, a method for producing the solid-state imaging device according to the invention will be described.

By using the conventional method, on a semiconductor substrate 8 are formed a plurality of photosensitive elements 1, a plurality of vertical CCD register portions 2 each including a CCD 31 and first and second polysilicon electrodes 9 and 10, a horizontal CCD register portion 3, an output portion 4, and an insulating film 12'. Thereafter, a light blocking film 11 made of aluminum is formed over the semiconductor substrate 8 for preventing light from reaching an area other the photosensitive elements 1. Then, a passivation film 12 is formed so as to cover the semiconductor substrate 8.

Next, by a spin coat method, a transparent resin layer 13 (thickness L: 10.5 μm) is formed on the passivation film 12. The transparent resin layer 13 is preferably made of acrylic resin. In this example, FVR-10 which is commercially available from FUJI YAKU-HIN KOGYO K. K. was used for the transparent resin layer 13. By using the spin coat method, the thicknesses in the vertical and the horizontal directions can be uniform.

Then, by a spin coat method, a microlens material (thickness T: 3 μm) is formed on the transparent resin layer 13. As the microlens material, a material which is photosensitive, transparent, and has a known thermal deformation characteristic is used. In this example, as the photoresist with photosensitivity, thermal deformation characteristic and superior transparency, CMS-DU which is commercially available from Tosoh Corp. was used.

Next, the curvature of the microlens 14 to be formed is determined by considering the thicknesses of the transparent resin layer 13 and the microlens 14. In this example, it was found that an appropriate curvature could be obtained by setting the shift amount Δw to be 0.85 μm as the result of the experiment. At this time, the curvature $r_v$ in the vertical direction and the curvature $r_h$ in the horizontal direction of the microlens were both about 0.2 /μm. As is seen from the graph of FIG. 3B, the shift amount Δw of 0.85 μm can be realized by setting the heating temperature at 160° C.

The resist pattern 19 is designed by considering, in addition to the above-mentioned shift amount, pitches of the photosensitive elements 1 in the horizontal and vertical directions, and a height 15 (FIG. 1A) from the surface of the semiconductor substrate 8 to the top face of the light blocking film 11. In addition, as is shown in FIG. 1B, it is desirable that the resist pattern 19 be formed in such a manner that, after heating, the adjacent microlenses 14 are in contact with each other in the vertical direction which has the smaller arranged pitches of the photosensitive elements 1.

Figure 1C:
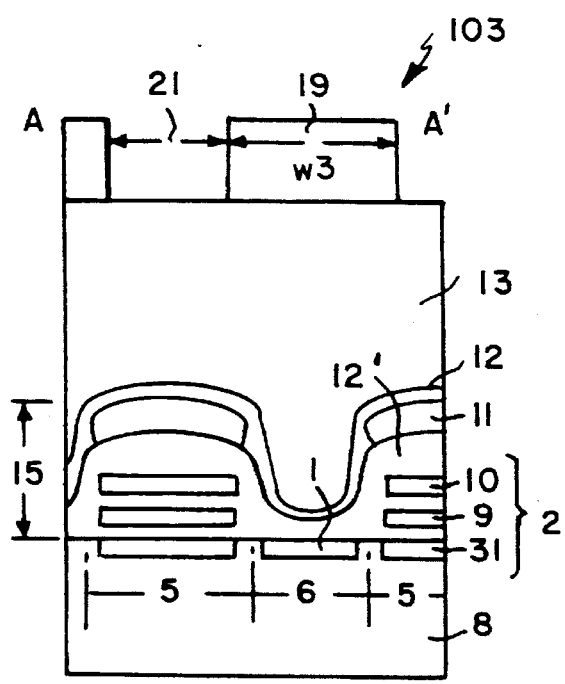
FIG. 1C is a cross-sectional view along the horizontal direction (taken along the line A–A' in FIG. 2) for illustrating a method for producing the solid-state imaging device according to the invention.
Figure 1D:
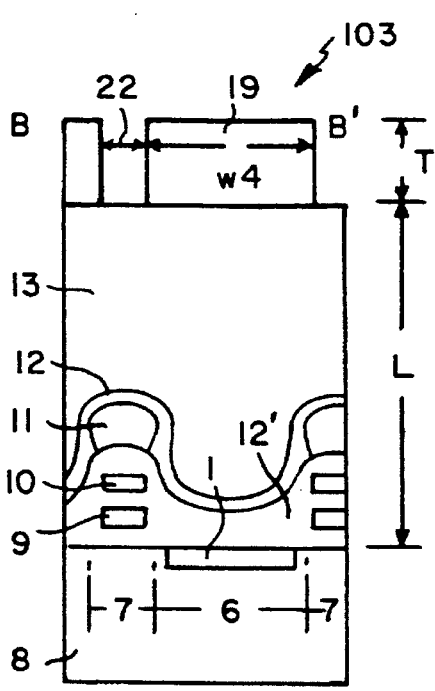
FIG. 1D is a cross-sectional view along the vertical direction (taken along the line B–B' in FIG. 2) for illustrating the method for producing the solid-state imaging device according to the invention.
Figure 4:
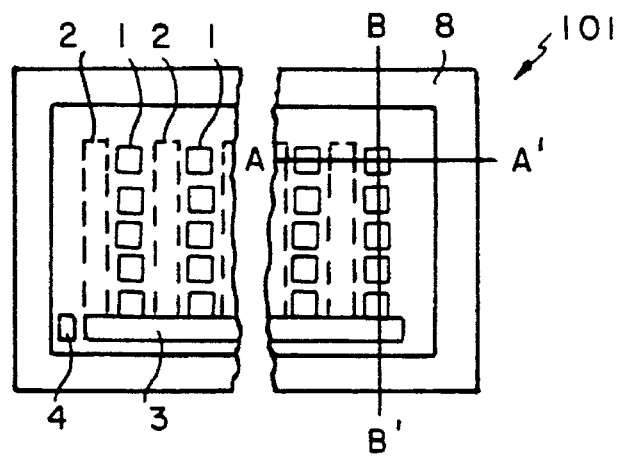
FIG. 4 is a plan view showing a solid-state imaging device in the prior art.
Figures 5A, 5B:
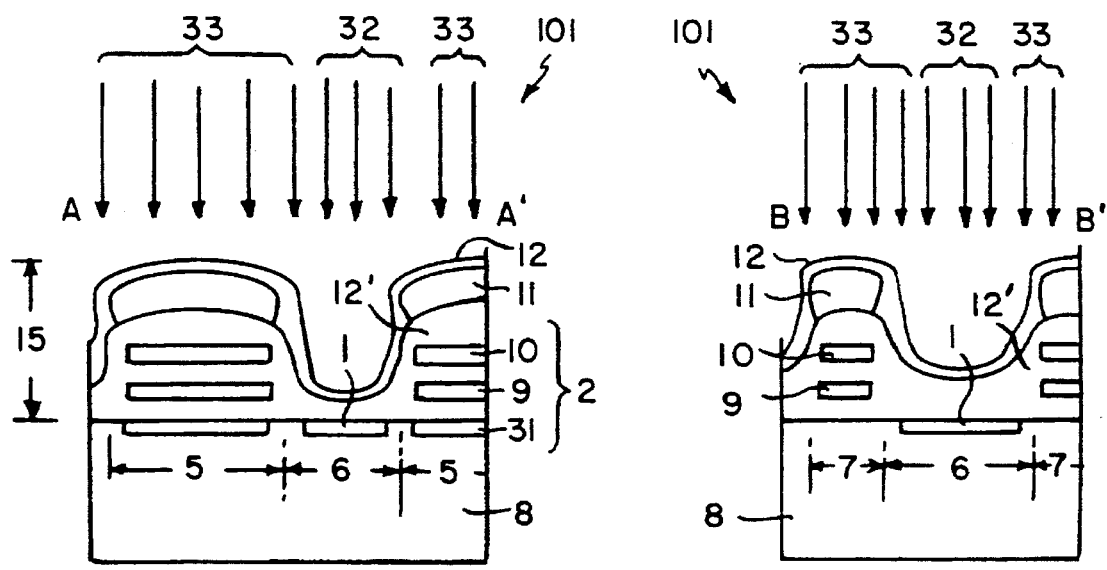
FIG. 5A is a cross-sectional view along the horizontal direction(taken along a line A–A' in FIG. 4) of the solid-state imaging device in the prior art.
FIG. 5B is a cross-sectional view along the vertical direction (taken along a line B–B' in FIG. 4) of the solid-state imaging device in the prior art.
Figure 6A:
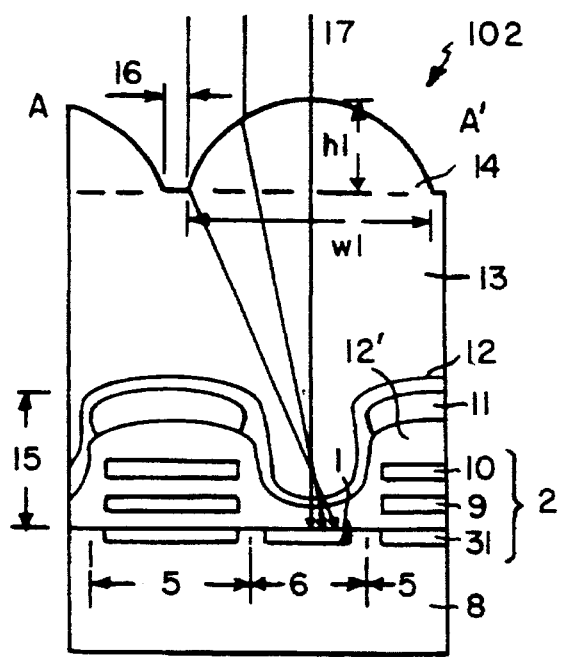
FIG. 6A is a cross-sectional view along the horizontal direction of a solid-state imaging device with microlenses according to the prior art.
Figure 6B:
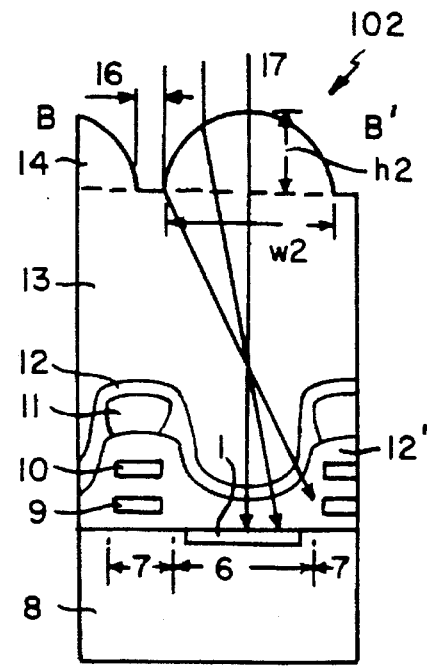
FIG. 6B is a cross-sectional view along the vertical direction of the solid-state imaging device with microlenses according to the prior art.
Figure 6C:
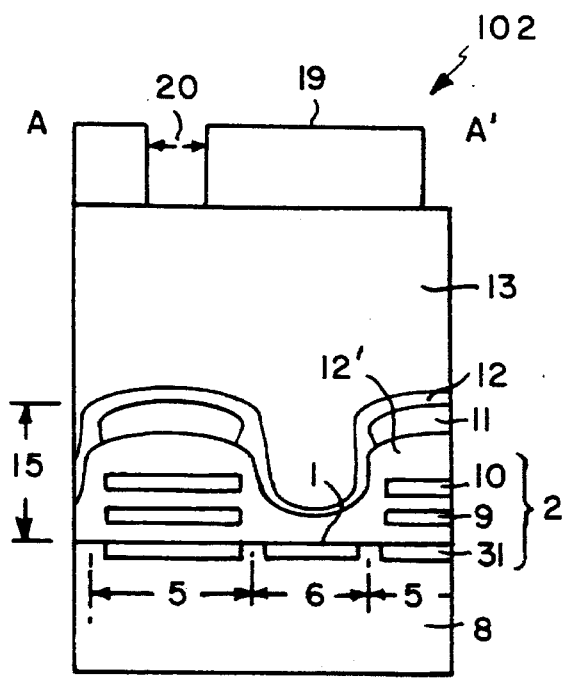
FIG. 6C is a cross-sectional view along the horizontal direction for illustrating a method for producing the solid-state imaging device with microlenses according to the prior art.
Figure 6D:
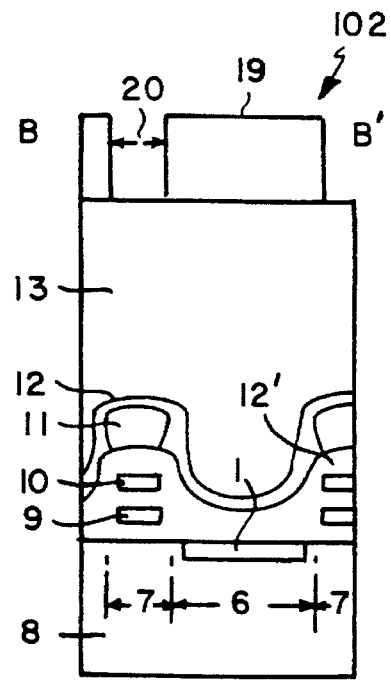
FIG. 6D is a cross-sectional view along the vertical direction for illustrating the method for producing the solid-state imaging device with microlenses according to the prior art.
Figure 7A:
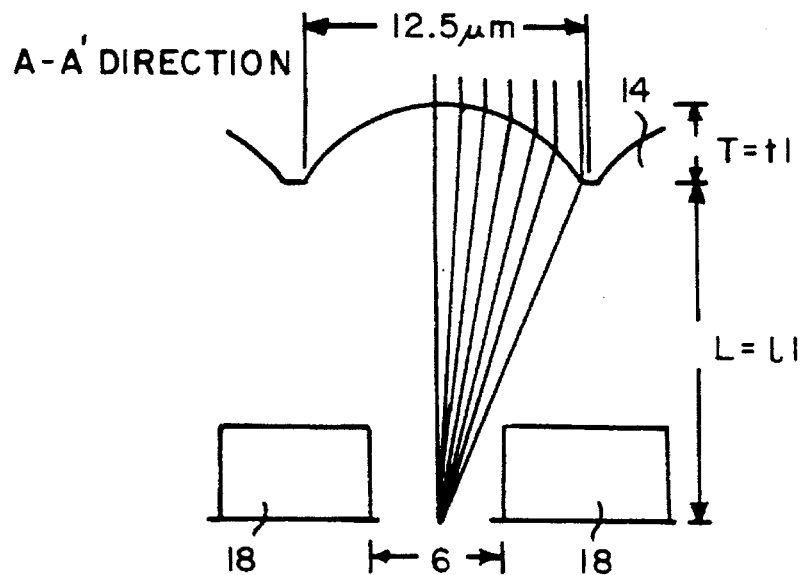
FIG. 7A shows the converging conditions of light along the horizontal direction of a solid-state imaging device having a photosensitive screen of ½-inch optical system for an interline transfer system for a NTSC system.
Figure 7B:
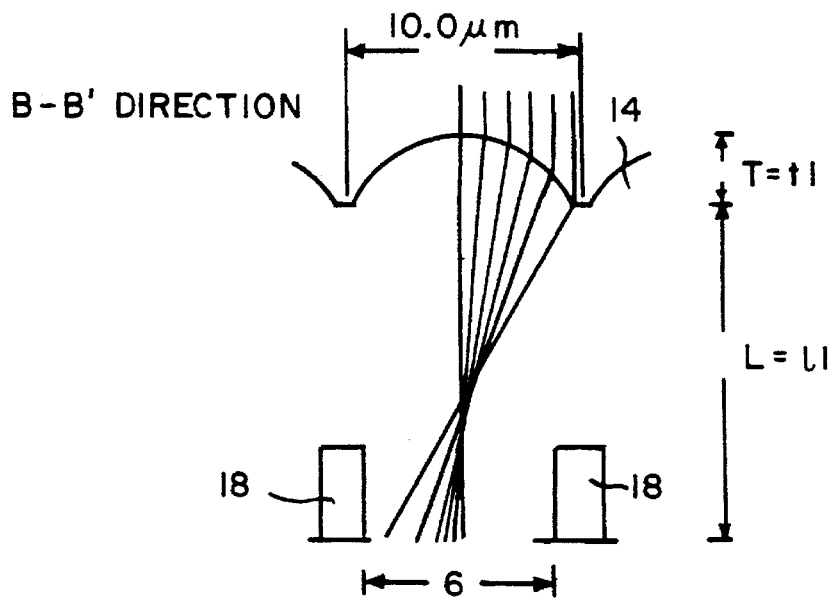
FIG. 7B shows the converging conditions of light along the vertical direction of the solid-state imaging device having a photosensitive screen of ½-inch optical system for an interline transfer system for a NTSC system.
Figure 8:
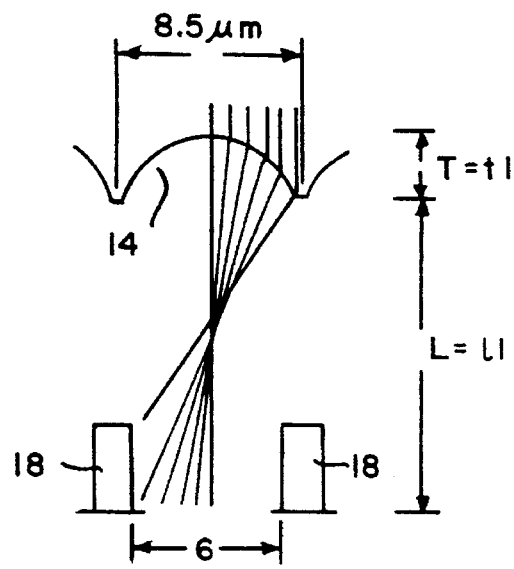
FIG. 8 shows the converging conditions of light along the vertical direction of a solid-state imaging device having a photosensitive screen of ½-inch optical system for an interline transfer system for a PAL system.
Figure 9A:
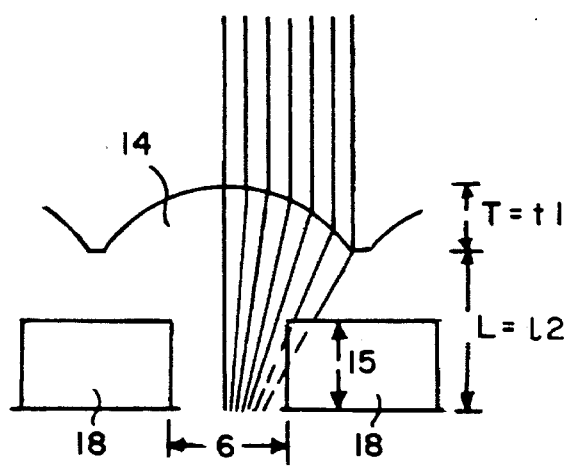
FIG. 9A shows the converging conditions of light along the horizontal direction of a solid-state imaging device having a photosensitive screen of ⅓-inch optical system for an interline transfer system for a NTSC systems.
Figure 9B:
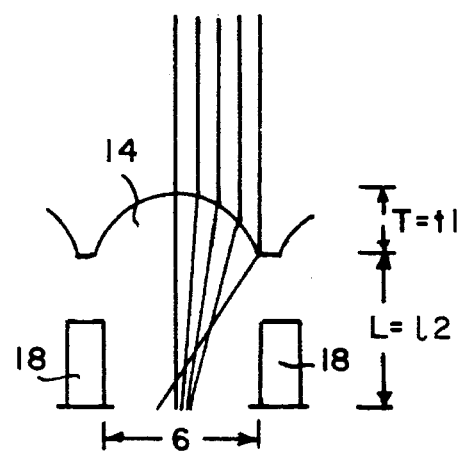
FIG. 9B shows the converging conditions of light along the vertical direction of the solid-state imaging device having a photosensitive screen of ⅓-inch optical system for an interline transfer system for a NTSC system.

In this example, as is shown in FIGS. 1C and 1D, the width w3 in the horizontal direction and the width w4 in the vertical direction of the resist pattern 19 are both set to be equal, for example 7.8 μm. By equalizing the values of the widths w3 and w4 of the resist pattern 19, the curvatures in the horizontal and the vertical directions after heating can also have the same value. The gap 21 in the horizontal direction and the gap 22 in the vertical direction of the resist pattern 19 are set to be 4.7 μm and 0.7 μm, respectively. In order to form the resist pattern 19 having the above-mentioned structure, an exposure development is performed by using a photo mask. Thus, the resist pattern 19 having the shape shown in FIGS. 1C and 1D is obtained.

Next, by using a clean oven or a hot plate, the semiconductor substrate 8 is heated at 160° C. for four minutes. By this heating, the resist pattern 19 is deformed, so as to form the microlens 14 with convexed curve. As is shown in FIG. 1B, the adjacent microlenses 14 are in contact with each other in the vertical direction. By this arrangement, the converging efficiency is more improved as compared with the case where they are not in contact with each other. The sensitivity of the solid-state imaging device 103 of this example is improved 2.1 to 2.6 times as compared with that of a conventional solid-state imaging device with no microlenses.

As described above, by setting the widths in the vertical and the horizontal directions of the resist pattern 19 for forming the microlens 14 to have the same value, the curvatures in the vertical and the horizontal directions of the microlens 14 can also have the same value. Thus, the focal length in the horizontal direction is equal to the focal length in the vertical direction. Therefore, the incident light will not be blocked by the light blocking film 11. Moreover, according to the invention, the light which is converged but is not incident on the photosensitive region 6 in the prior art can be converged on the photosensitive region 6. As a result, the converging efficiency is improved. Thus, for the miniaturized device and the high integration of pixels which are strongly required, high sensitivity can be realized by forming microlenses with good converging efficiency.

In addition, by considering the thermal deformation characteristic of the material for the microlens 14, and by studying the relationship between the heating temperature and the shift amount, the curvatures of the microlens 14 and the widths of the microlens 14 can be controlled. As a result, the adjacent microlenses 14 can be formed in such a manner that they are in contact with each other in one of the directions whichever has the smaller arranged pitches of the photosensitive elements 1. Therefore, the focal lengths in the vertical and the horizontal directions of the microlens 14 can have the same value, and the light receiving area can be maximized. Thus, the converging efficiency can be improved.

In the above example, the present invention is applied to the solid-state imaging device having a photosensitive screen of ½-inch optical system for PAL system. The invention is not limited to this specific application. By considering the thermal deformation characteristic of the microlens material, the invention can be applied to a solid-state imaging device having a photosensitive screen of ⅓-inch optical system for a NTSC system, or a solid-state imaging device having a photosensitive screen of ⅓-inch optical system for a PAL system. Also for these devices, the converging efficiency can be improved.

In the above example, the solid-state imaging device of interline transfer system is described. The invention is not limited to the specific example. It is appreciated that the invention can be applied to a high definition television (HDTV), or a solid-state imaging device with different pitches of pixels in the horizontal direction and the vertical direction. Furthermore, the invention can be applied to any type of solid-state imaging device such as a color solid-state imaging device in which color filters are provided, a CCD image sensor of frame transfer system, or an MOS image sensor. Essentially, the invention can be applied to any type of solid-state imaging device, if the device includes a photosensitive portion for receiving light and for converting the light into electric charge, a transfer portion for sequentially reading the electric charge, and an output portion on a semiconductor substrate of one conductivity type.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device comprising:

a plurality of photosensitive elements for converting light into electric charge, said plurality of photosensitive elements being arranged in a matrix form along a first direction and a second direction, wherein a pitch of said photosensitive elements in said first direction is different from a pitch of said photosensitive elements in said second direction;

a plurality of first charge transfer portions for transferring said electric charge converted in each of said plurality of photosensitive elements in a first direction, said plurality of first charge transfer portions being formed between said plurality of photosensitive elements along said first direction;

a second charge transfer portion for receiving said electric charge from said plurality of first charge transfer portions and for transferring said electric charge in a second direction, said second charge transfer portion being provided at an end of each of said plurality of first charge transfer portions;

a plurality of light converging portions for converging said light on each of said plurality of photosensitive elements, said plurality of light converging portions being formed over said plurality of photosensitive elements, respectively, wherein said light converging portion and light converging portions adjacent thereto are in contact with each other, in a direction corresponding to the direction of the shortest pitch of said photosensitive elements, and are not in contact with each other in a direction corresponding to the direction of the longest pitch of said photosensitive elements; and wherein said plurality of light converging portions are microlenses, each of said microlenses having substantially the same curvatures in said first and second directions.

2. A solid-state imaging device comprising:

a plurality of photosensitive elements for converting light into electric charge, said plurality of photosensitive elements being arranged in a matrix form along a first direction and a second direction, wherein a pitch of said photosensitive elements in said first direction is different from a pitch of said photosensitive elements in said second direction;

a plurality of light converging portions for converging said light on each of said plurality of photosensitive elements, said plurality of light converging portions being formed over said plurality of photosensitive elements, respectively, wherein said light converging portion and light converging portions adjacent thereto are in contact with each other, in a direction corresponding to the direction of the shortest pitch of said photosensitive elements, and are not in contact with each other in a direction corresponding to the direction of the longest pitch of said photosensitive elements; and wherein said plurality of light converging portions are microlenses, each of said microlenses having substantially the same curvatures in said first and second directions.

3. A solid-state imaging device according to claim 2, wherein a convexed curve of each microlens physically intersects with a convexed curve of microlens adjacent to said each microlens.

* * * * *